United States Patent
Huesken et al.

(10) Patent No.: US 9,013,027 B2
(45) Date of Patent: Apr. 21, 2015

(54) SEMICONDUCTOR DEVICE, A SEMICONDUCTOR WAFER STRUCTURE, AND A METHOD FOR FORMING A SEMICONDUCTOR WAFER STRUCTURE

(71) Applicant: Infineon Technologies AG, Neubiberg (DE)

(72) Inventors: Holger Huesken, München (DE); Francisco Javier Santos Rodriguez, Villach (AT); Wolfgang Wagner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/950,783

(22) Filed: Jul. 25, 2013

(65) Prior Publication Data

US 2015/0028456 A1    Jan. 29, 2015

(51) Int. Cl.
*H01L 21/00* (2006.01)
*H01L 23/00* (2006.01)
*H01L 21/762* (2006.01)

(52) U.S. Cl.
CPC ........ *H01L 23/562* (2013.01); *H01L 21/76202* (2013.01)

(58) Field of Classification Search
USPC ......... 257/629, 631–634, 638, 374, 404, 424; 438/627, 643
See application file for complete search history.

(56) References Cited

U.S. PATENT DOCUMENTS

| | | | | |
|---|---|---|---|---|
| 5,358,733 | A | * | 10/1994 | Lur et al. ............. 438/598 |
| 2009/0140330 | A1 | * | 6/2009 | Yagi et al. ............. 257/330 |

OTHER PUBLICATIONS

Singh et al. "Enhancement in wafer bow of free-standing GaN substrates due to high-dose hydrogen implantation: implications for GaN layer transfer applications." Semiconductor Science and Technology, vol. 22. IOP Publishing, 2007. pp. 418-421.
Steimetz et al. "Eliminating bowing in bue LED and laser epi." Semiconductor Today: Compounds & Advanced Silicon, vol. 2, Issue 3. Apr. 2007. pp. 38-40.
Turner et al. "Effect of Wafer Bow and Etch Patterns in Direct Wafer Bonding." Advanced Materials for Micro- and Nano-Systems (AMMNS), 2003. pp. 1-8.

* cited by examiner

*Primary Examiner* — Richard Booth
(74) *Attorney, Agent, or Firm* — Murphy, Bilak & Homiller, PLLC

(57) ABSTRACT

Embodiments relate to a semiconductor device, a semiconductor wafer structure, and a method for manufacturing or forming a semiconductor wafer structure. The semiconductor device includes a semiconductor substrate with a first region having a first conductivity type and a second region having a second conductivity type. The semiconductor device further includes an oxide structure with interrupted areas and a metal layer structure being in contact with the second region at least at the interrupted areas of the oxide.

21 Claims, 5 Drawing Sheets

SEMICONDUCTOR DEVICE, A SEMICONDUCTOR WAFER STRUCTURE, AND A METHOD FOR FORMING A SEMICONDUCTOR WAFER STRUCTURE

TECHNICAL FIELD

Embodiments relate to measures for decreasing a bow of a semiconductor substrate or device, more particularly but not exclusively to a semiconductor device, a semiconductor wafer structure, and a method for manufacturing or forming a semiconductor wafer structure.

BACKGROUND

When forming semiconductor arrangements multiple layers or regions of different material are brought together using different manufacturing or forming techniques, such as coating, deposition, etching, vapor deposition etc. The multiple layers and different materials may have different properties, etc. mechanical stability, expansion coefficients, etc. Depending on the different layers and processes mechanical tension or stress may occur in the semiconductor arrangements, which may lead to deformation of the semiconductor material. For example, a semiconductor wafer may bow, which is also referred to as wafer bow.

SUMMARY

An embodiment relates to a semiconductor device. The semiconductor device comprises a semiconductor substrate with a first region having a first conductivity type and a second region having a second conductivity type. The second region comprises one or more sections of the second conductivity type. The semiconductor device further comprises an oxide structure with interrupted areas and a metal layer structure being in contact with the second region at least at the interrupted areas of the oxide. A projection of the oxide structure onto the second region determines at least two interrupted areas, which are separated by portions of the oxide structure. The at least two interrupted areas are projected into at least one of the one or more sections of the second region.

The oxide structure may enable a stabilization of the semiconductor substrate against mechanical force exerted by the metal layer. A bow of the semiconductor substrate, which may be caused by the metal layer, may be reduced by the oxide layer. The metal layer structure may exert a force on the semiconductor substrate and the oxide structure may also exert a force on the semiconductor substrate or the metal layer structure. In some embodiments the force exerted by the oxide structure is at least partly directed into an opposite direction of the force exerted by the metal layer structure.

In embodiments the metal layer structure may correspond to power metal layer operable to contact the semiconductor device. The power metal layer may have a certain thickness in order to allow current flows determined by the respective application of the semiconductor device. For example, high power semiconductor applications may determine high current flows. The thickness of the metal layer may determine mechanical tensions exerted on the semiconductor material, which may at least partly be compensated by the oxide structure.

In further embodiments the oxide structure may subdivide at least a part of a contact area of the second region of the semiconductor substrate or the meal layer structure into partitions separated by portions of the oxide structure. In some embodiments the second region comprises two or more sections of the second conductivity type. A projection of the oxide structure onto the second region may subdivide at least one of the two or more sections of the second region into at least two interrupted areas separated by portions of the oxide structure. A lateral width of a portion of the oxide structure may be less than a diffusion length of charge carriers in the second region of the semiconductor substrate. In some embodiments the oxide structure may therefore be electrically in-effective, for example, the oxide structure may not influence electrical properties of the semiconductor device essentially, or it may only take a slight or negligible effect on the electrical properties of the semiconductor circuit.

Embodiments also relate to a semiconductor wafer structure comprising a plurality of the above described semiconductor devices. The tension exerted by the metal layer may then affect the semiconductor wafer likewise, deformations may be even more signification due to the larger areas covered by the metal structure on the semiconductor wafer. The oxide structure may then at least partly compensate the force exerted by the metal layer structure throughout the semiconductor wafer. In some embodiments the oxide structure may therefore allow for a reduction of a wafer-bow of the semiconductor wafer.

Embodiments also relate to a method for forming a semiconductor wafer structure. The method comprises forming a semiconductor substrate with a first region having a first conductivity type and a second region having a second conductivity type. The second region comprises one or more sections of the second conductivity type. The method further comprises forming an oxide structure with interrupted areas of oxide and a metal layer structure contacting the second region at least at the interrupted areas of the oxide. A projection of the oxide structure onto the second region determines at least two interrupted areas, which are separated by portions of the oxide structure, in at least one of the one or more sections of the second region. The method for forming may likewise allow forming the wafer structure with reduced mechanical deformations, such as wafer-bow.

In some embodiments the oxide structure is formed by forming an oxide layer and subsequently removing oxide from the formed oxide layer to obtain the interrupted areas in the oxide structure. Some embodiments may therefore provide cost advantages as an oxide layer, which is used for other purposes in the forming process, for example to form an insulation structure, may only be partly removed. The oxide layer may therefore not generate extra costs and the partial removal of the oxide layer to obtain the oxide structure may be carried out using rather cost efficient process steps, for example, masking, etching, etc.

BRIEF DESCRIPTION OF THE DRAWINGS

Some embodiments of apparatuses and/or methods will be described in the following by way of example only, and with reference to the accompanying figures, in which.

DETAILED DESCRIPTION

Figure 1:
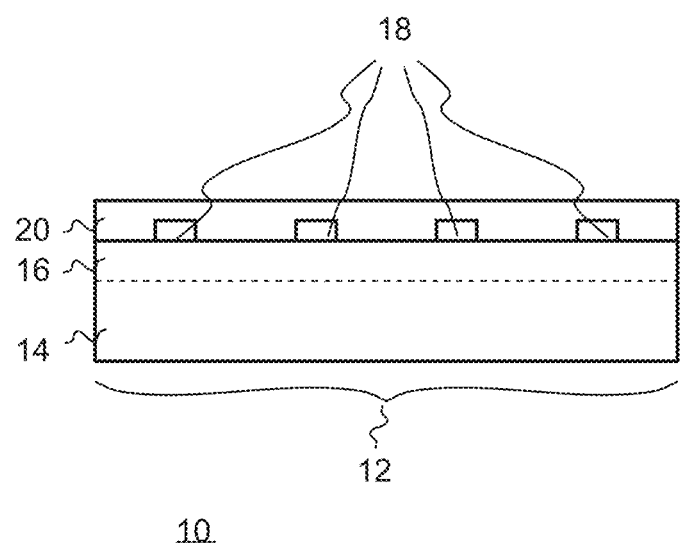
FIG. 1 illustrates an embodiment of a semiconductor device.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Embodiments may relate to any kind of semiconductor device, such as a diode, a transistor, a chip, etc. In the following some embodiments will be described in which the semiconductor circuit corresponds to a diode. Furthermore, the forming or manufacturing process for such a diode will be described, which may show at least some of the effects, which may be reduced or overcome using the oxide structure. For example, Emitter Controlled diodes (EmCon) may use PowerCopper as a metal layer, which may, after thinning of the semiconductor substrate lead to a higher wafer-bow compared to using aluminum-silicon-copper (AlSiCu) alloy as a metal layer for contact pads of a semiconductor device.

In some embodiments the bow of a semiconductor substrate or a wafer may be dominated by the metal layer. Such a bow may be based on one or more tensile and compression components or stress components. For example, a bather layer may be located between the metal layer and the semiconductor substrate. The barrier layer may have a thickness of multiple 100 nm, e.g. 300, 400, 500, 600, 700, or 1000 nm, and it may exert compression stress or force onto the semiconductor substrate. The metal layer, e.g. copper, may have a thickness of multiple µm, e.g. 1, 2, 3, 5, 7, or 10 µm and it may exert tensile stress or force onto the semiconductor substrate or any other layers coupled to the semiconductor substrate. The tensile force of the metal layer may over-compensate the compression force of the barrier layer such that an overall tensile force may result, which may then cause the bow.

In the following embodiments there may be a barrier layer between the metal layer and semiconductor substrate. A barrier metal may be used in integrated circuits or semiconductors to chemically isolate semiconductors from soft metal interconnects, while maintaining an electrical connection between them. For instance, a layer of barrier metal may prevent diffusion of copper into surrounding semiconductor materials. A barrier metal may have high electrical conductivity in order to maintain a good electronic contact, while maintaining a low enough copper diffusivity to sufficiently chemically isolate copper conductor films or layers from underlying semiconductor substrate, such as silicon. The thickness of the barrier layer may also determine these effects.

The wafer bow may cause limitations on the forming processes of semiconductor devices and wafers as only limited bows may be tolerable. A process windows relating the thickness of, for example, a copper layer and an overall thickness of the semiconductor device may therefore be limited by the bow of the wafer or the semiconductor substrate. The thickness of the wafer or the semiconductor device may however influence its dynamic performance. For example, the thickness of a metal layer may determine the robustness of the semiconductor device. The thicker the metal layer the more robust the semiconductor device may be. As an example, the thickness of the metal layer of a diode may determine a peak current robustness, a peak withstand current, or a surge current strength of the diode. A limitation of the thickness of the metal layer, as it may be determined by the bow, may therefore limit the dynamical performance of the semiconductor device, e.g. in terms of a peak current robustness or a surge current strength.

Figure 2:
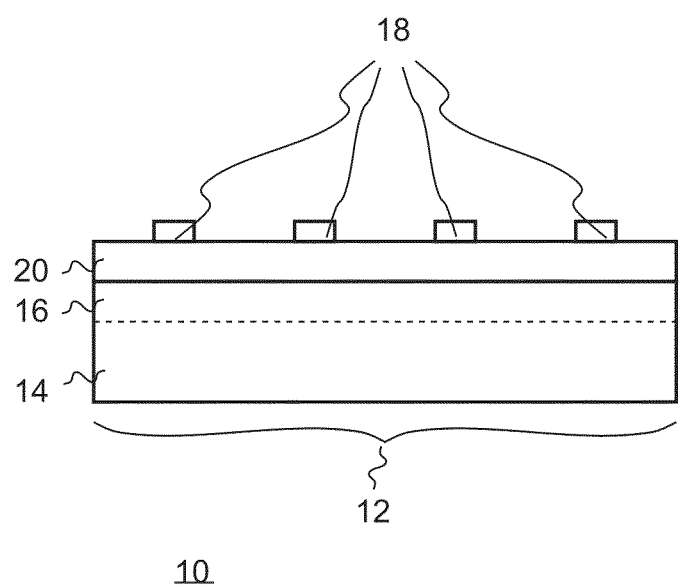
FIG. 2 illustrates another embodiment of a semiconductor device.

FIGS. 1 and 2 show two embodiments of semiconductor devices 10. Each of FIGS. 1 and 2 shows a semiconductor device 10, which comprises a semiconductor substrate 12 with a first region 14 having a first conductivity type and a second region 16 having a second conductivity type. The second region 16 comprises one or more sections of the second conductivity type. In FIGS. 1 and 2 the first and second regions 14 and 16 are illustrated by layers, where the first region 14 is at the bottom and the second region 16 is on top of the semiconductor substrate 12. In further embodiments the regions 14 and 16 may not be layers, but the second region 16 may be embedded in the first region 14. The second region 16 may then correspond to a surface region 16 partly embedded or surrounded by the first region 14. In other words, in some embodiments the first region 14 of the semiconductor substrate 12 surrounds the second region 16 of the semiconductor substrate 12.

A main surface of the semiconductor device 10 may be a semiconductor surface of the device towards metal layers, insulation layers or passivation layers on top of the semiconductor surface, which may at least partly be constituted by the second region 16. In comparison to a basically vertical edge (e.g. resulting from separating the semiconductor dies from others) of the semiconductor structure, the main surface of the semiconductor structure may be a basically horizontal surface extending laterally. The main surface of the semiconductor structure may be a basically even plane (e.g. neglecting unevenness of the semiconductor structure due to the manufacturing process). In other words, the main surface of the semiconductor device 10 may be the interface between the semi-conductor material and an insulation layer, metal layer or passivation layer on top of the semiconductor substrate. In other words, a lateral direction or lateral expansion may be oriented basically in parallel to the main surface and a vertical direction or vertical expansion may be oriented basically orthogonal to the main surface.

In some embodiments the semiconductor substrate 12 may correspond, for example, to a silicon substrate or the semiconductor device 10 may be a silicon-based semiconductor structure, a silicon carbide-based semiconductor structure, a gallium arsenide-based semiconductor structure, a silicon-germanium-based or a gallium nitride-based semiconductor structure, for example. The first and second regions 14 and 16 differ in their conductivity types. The conductivity types may differ in different doping types of the semiconductor, e.g. p or n-type. For example, the first region 14 has an n-type doping and the second region 16 has a p-type doping, e.g. the p-type doping may be caused by incorporating aluminum ions or boron ions into the substrate. In some embodiments the second conductivity type may indicate an opposite n-doping or p-doping compared to the first conductivity type. In other words, the first conductivity type may indicate an n-doping and the second conductivity type may indicate a p-doping or vice-versa. For example, the second region 16 may comprise a doping of the second conductivity type over more than 50% (or more than 70%, more than 80% or more than 90%) of its volume, for example.

FIGS. 1 and 2 further show that the semiconductor device 10 comprises an oxide structure 18 with interrupted areas. The interrupted areas may correspond to areas, in which there is no oxide or in which oxide has been removed. In at least one of the one or more sections of the second region 16, a projection of the oxide structure 18 onto the second region 16 determines at least two interrupted areas, which are separated by portions of the oxide structure 18. The term projection shall indicate that the oxide structure 18 may not be in direct contact with the one or more sections of the second region 16. FIG. 2 illustrates an embodiment, in which a metal layer 20 lies between the oxide structure 18 and the second region 16. In further embodiments there may be multiple other layers or structures between the oxide structure 18 and the second region 16. The term projection indicates that when the oxide structure 18 is projected from a direction vertical to the main surface of the semiconductor device 10 into a plane, such that the structures of the oxide structure 18 and the second region 16 overlap (are projected or mapped onto each other), there is at least one section of the second region 16, which comprises two interrupted areas of the oxide structure 18.

The oxide may serve insulation purposes at other areas or regions on the surface. At least at the interrupted areas an ohmic contact, i.e. a contact with ohmic resistance, to the metal layer structure 20 or the second region 16 may be enabled. The plurality of interrupted areas may be surrounded by the oxide structure 18, which may be formed from an oxide layer in which the interrupted areas are etched into. The oxide structure 18 may extend throughout the second region 16 and it may comprise a plurality of interrupted areas on the surface of the second region 16. The second region 16 may cover more than 30%, 40%, 50%, 60%, 70%, 80%, or 90% of the main surface of the semiconductor substrate 12. Moreover, the oxide structure 18 may comprise regions of oxide and regions of interrupted areas. In some embodiments an area covered with oxide may be smaller than an area of the interrupted areas. The oxide structure 18 may have a basically constant thickness (vertically to the main surface) outside the interrupted areas.

The oxide may correspond to silicon dioxide, which may be formed using LOCal Oxidation of Silicon (LOCOS). LOCOS is an example of a (micro) fabrication process in which silicon dioxide is formed in selected areas on a silicon wafer or on the semiconductor substrate. This process may be used to create a silicon oxide insulating structure. As further shown in FIGS. 1 and 2 the semiconductor device 10 further comprises a metal layer structure 20 being in contact with the second region 16 at least at the interrupted areas of the oxide 18. In some embodiments, the metal layer structure 20 may correspond to a power metal layer operable to contact the semiconductor device 10.

The embodiments illustrated by FIGS. 1 and 2 differ in the order of the oxide structure 18 and the metal layer 20. In the embodiment depicted in FIG. 1, the oxide structure 18 is located directly between the metal layer structure 20 and the second region 16 of the semiconductor device 12. In the embodiment depicted in FIG. 2, the metal layer structure 20 is located between directly the oxide structure 18 and the second region 16 of the semiconductor device 12. In further embodiments the oxide structure 18 may be enclosed by two metal layer structures in the area of the second region 16. In other words, the oxide structure 18 may be sandwiched by two metal layers in some embodiments.

In some embodiments the metal layer structure 20 may cover more than 50%, 60%, 70%, or 80% of the main surface of the semiconductor device 10, or the second region 16 thereof, respectively. As shown in FIGS. 1 and 2 the metal layer structure 20 may have a lateral extension as large as the main surface of the semiconductor substrate 12. In further embodiments the metal layer structure 20 may cover at least a significant portion of the surface of the second region 16. Moreover, the metal layer structure 20 may be coupled or directly coupled to the second region 16, for example, with only a barrier region or layer in between. The coupling between the metal layer structure 20 and the second region 16 may allow a current to flow from the metal layer 20 to the second region 16.

In embodiments the oxide structure 18 may provide an additional degree of freedom for influencing or controlling the bow of the semiconductor device 10 or a wafer. For example, the anode of a diode may, as a start, be laminary and unstructured. At the borders of the chip there may be a high voltage edge termination, e.g. a field plate termination, which may comprise oxide with a variable thickness. For example, diodes with high nominal currents, e.g. 100 A or more, may principally use low percentages of oxide covering of the wafer, where in embodiments the oxide structure 18 may increase a percentage of lateral covering with oxide, and additional compression or tensile tension may result. Embodiments may relate to a power semiconductor device 10. For example, the semiconductor device may correspond to a diode with a blocking voltage of more than 50V, 100V, 250V, 500V, 1000V, etc.

The covering with oxide may be achieved, for example, using a thermal process as LOCOS or a chemical process such as Chemical Vapour Deposition (CVD). In embodiments the oxide structure 18, e.g. on an anode, may be adapted to a desired tension or force. For example, the metal layer structure 20 exerts a force on the semiconductor substrate 12 and the oxide structure 18 exerts a force on the semiconductor substrate 12 or the metal layer structure 20. The force exerted by the oxide structure 18 may then at least partly be directed into an opposite direction of the force exerted by the metal layer structure 20.

In an embodiment of a diode, the layout of the oxide structure 18 may be chosen in a way that a compression stress exerted by the oxide structure 18 at least partly, in an ideal case even completely, compensates a tensile stress exerted by the metal layer structure 20. In further embodiments, there may be multiple layers of metal, oxide, semiconductor material, etc. structures. That is to say that the semiconductor device 10 may comprise one or more other layers exerting force on the semiconductor substrate 12 and the oxide structure 18 may be configured to exert a force at least partly directed into an opposite direction of a combined force of at least two of the other layers. Embodiment may allow an overall or combined stress, evoked by multiple layers or structures on the semiconductor substrate 12, being reduced by the oxide structure 18.

The force or stress exerted by the oxide structure 18 may be influenced by its lateral geometry and by its thickness. That is to say that, for example, a preliminary stress or tension of a semiconductor wafer or a semiconductor device 10 may be determined by the oxide structure 18, e.g. by means of its geometry and/or its thickness. Embodiments may provide two degrees of freedom for the stress adaptation of the oxide structure 18, its geometry and its thickness.

The oxide structure 18, e.g. in an anode area of a diode, may have any layout and in principal any structure. In some embodiments the oxide structure 18 subdivides at least a part of a contact area of the second region 16 or the meal layer structure 20 into partitions separated by portions or walls of the oxide structure 18. In some embodiments the second region 16 comprises two or more sections of the second conductivity type. A projection of the oxide structure 18 onto the second region 16 subdivides at least one of the two or more sections of the second region 16 into at least two interrupted areas separated by portions of the oxide structure 18.

Figure 3:
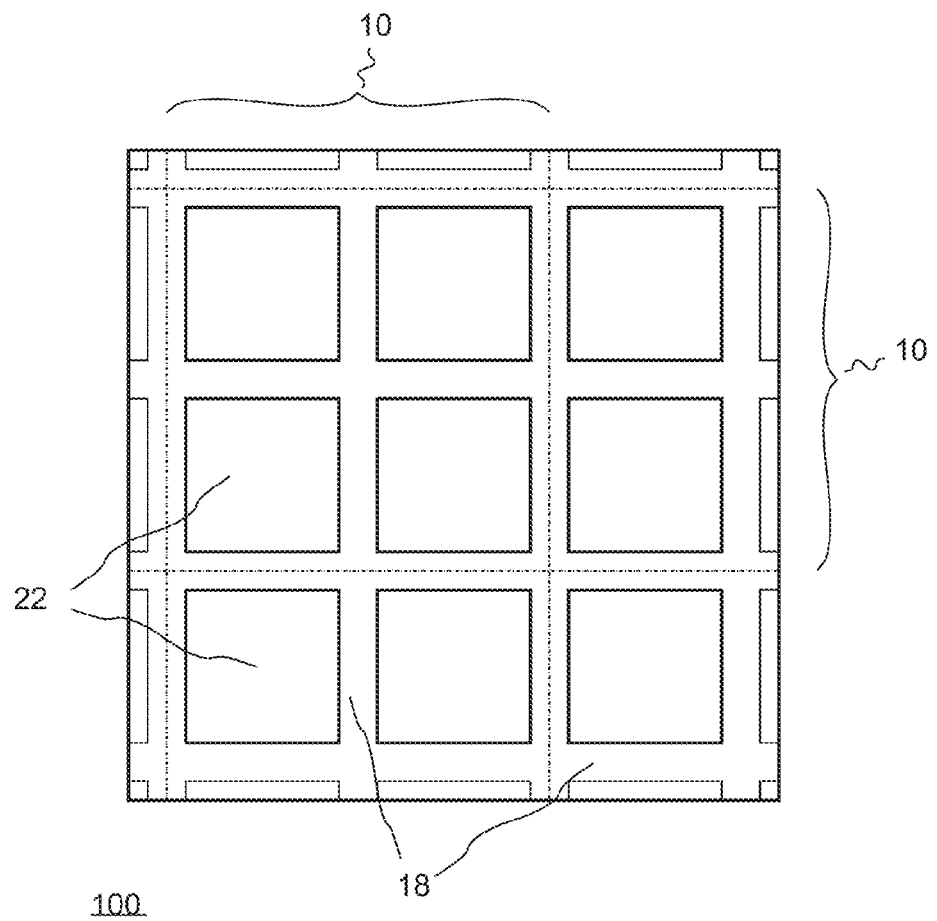
FIG. 3 illustrates an embodiment of a semiconductor wafer.

FIG. 3 illustrates a section of a semiconductor wafer structure 100 comprising a plurality of the semiconductor devices 10 as described above. The semiconductor devices 10 are indicated between interrupted lines in FIG. 3. The semiconductor devices 10 may be separated, for example, by cutting or sawing along these lines. The oxide structure 18 is shown as a grid structure, spanning a cross-shaped structure on the semiconductor devices 10, and surrounding interrupted square shaped areas 22. Similar to what is described above with respect to the semiconductor device 10 forces are exerted on the wafer 100 according to the material of the structures formed thereon. If the same structure as described above is assumed, then the metal layer structure 20 exerts a force on the semiconductor substrate of the wafer 100. The oxide structure 18 exerts a force on the semiconductor substrate or the metal layer structure of the wafer 100. The force exerted by the oxide structure 18 is at least partly directed into an opposite direction of the force exerted by the metal layer structure 20.

In some embodiments the oxide structure 18 comprises a grid-structure. Moreover, the oxide structure 18 may be symmetrical to at least one lateral direction along a surface of the semiconductor device 10. For example, a symmetrical structure of the oxide 18 may prevent predominant directions of the stress or tension, which could cause twist, warp or distortion of the semiconductor device 10 or the wafer 100, respectively. The oxide structure 18 may, for example, be shaped in a mesh-, honeycomb-, or diamond-like shape. Principally, any structure is conceivable. The oxide structure 18 may be symmetrical to at least one wafer axis or radially symmetrical to the wafer structure 100.

In the embodiment depicted in FIG. 3, the oxide structure 18 extends throughout the plurality of the semiconductor devices 10. It is to be noted that outside a cell region, where cell region refers to, for example, an active region in which current may flow in an active state of the semiconductor device 10, there may be an edge termination to or through which the oxide structure 18 may extend. In other words, oxide structures 18 of different semiconductor devices 10 may be coupled to or interconnected through termination oxide structures at the edges of the individual semiconductor devices 10 on a wafer. In the areas outside the second regions 16 of the semiconductor devices 10 the structure of the oxide structure 18 may be different, for example, wall widths, interrupted areas 22, etc. may be different. In some embodiments of a wafer structure there may not be any interrupted areas 22 or interrupted areas of different sizes or shapes in a projection outside the second region 16.

In some embodiments the metal layer structure 20 may cover more than 50%, 60%, 70%, or 80% of the main surface of the semiconductor wafer 100, or the second regions 16 thereof, respectively. The metal layer structure 20 and the oxide structure 18 may extend continuously throughout the semiconductor wafer 100 and may cover respective portions of the wafer 100 surface. The width of the oxide 18 walls between the interrupted areas 22 and the width of the interrupted areas 22 may determine the stress or tension exerted by the oxide structure 18. Variations of these parameters may result in further geometries. In some embodiments the width of the oxide walls 18 may determine an influence on the electrical properties of the semiconductor device 10. A lateral width of a portion or wall of the oxide structure 18 may be less than a diffusion length of charge carriers in the second region 16 underneath. The influence of oxide structure 18 on the electrical properties of the semiconductor device 10 may therewith be controlled.

In embodiments geometry of areas covered with the oxide structure 18 or the interrupted areas may be freely selected. In some embodiments these areas may be radially symmetrical to a wafer axis, which may avoid or reduce twist, warp or distortion of the wafer 100. It is to be noted that the grid structure 18 depicted in FIG. 3 is only an example. There may not be any restriction in embodiments on whether areas covered with oxide would have to be connected or separated.

In some embodiments the first region 14 of the semiconductor substrate 12 corresponds to an n-type semiconductor material and the second region 16 of the semiconductor substrate 12 corresponds to a layer or region of p-type semiconductor material. For example, the oxide structure 18 may be underlayed with a continuous homogeneous p-region 16 with low injection efficiency. Therefore, a width of the oxide structure 18 may be selected smaller than the diffusion length of the minority carriers in the anode area and inhomogeneity of the current flow may be reduced or avoided, as inhomogeneities may negatively influence robustness and current flow characteristics of the semiconductor device 10, in particular if the oxide structure 18 is located between the metal layer structure 20 and the semiconductor substrate 12, cf. FIG. 1. In some embodiments any point on the semiconductor structure 18 may not be spaced further from a contact area, e.g. an interrupted area, between the metal layer structure 20 and the semiconductor substrate 12 than half of the diffusion length of the charge carriers.

Figure 4:
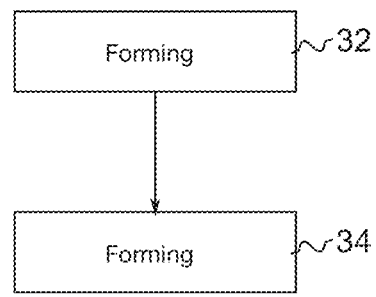
FIG. 4 illustrates a block diagram of a flow chart of an embodiment of a method for forming a semiconductor wafer structure.

FIG. 4 illustrates a block diagram of a flow chart of an embodiment of a method for forming or manufacturing a semiconductor wafer structure 100. The method comprises forming 32 a semiconductor substrate 12 with a first region 14 having a first conductivity type and a second region 16 having a second conductivity type. The second region comprises one or more sections of the second conductivity type. The method further comprises forming 34 an oxide structure 18 with interrupted areas 22 of oxide and a metal layer structure 20 contacting the second region 16 at least at the interrupted areas 22 of the oxide. A projection of the oxide structure 18 onto the second region 16 determines at least two interrupted areas 22, which are separated by portions of the oxide structure 18, in at least one of the one or more sections of the second region 16. In some embodiments the oxide structure 18 is formed by forming an oxide layer, and subsequently removing oxide from the formed oxide layer to obtain the interrupted areas 22 in the oxide structure 18. In some embodiments the forming of the oxide layer may be part of another processing step, such as forming an insulation layer for edge termination of the semiconductor devices 10. Hence, the forming of the oxide structure 18 may then correspond to a modified oxide removal step. Embodiments may therefore be cost efficient, as an oxide layer may have been formed anyway, but the removal of oxide from the oxide layer is modified to result in the oxide structure 18.

In some embodiments the semiconductor substrate 12 comprises silicon and the oxide structure 18 is formed using LOCal Oxidation of Silicon, LOCOS, according to the above description. In line with the above the oxide structure 18 may be formed between the metal layer structure 20 and the second region 16 of the semiconductor substrate 12. In other embodiments, the metal layer structure 20 may be formed between the oxide structure 18 and the second region 16 of the semiconductor substrate 12.

Figure 5:
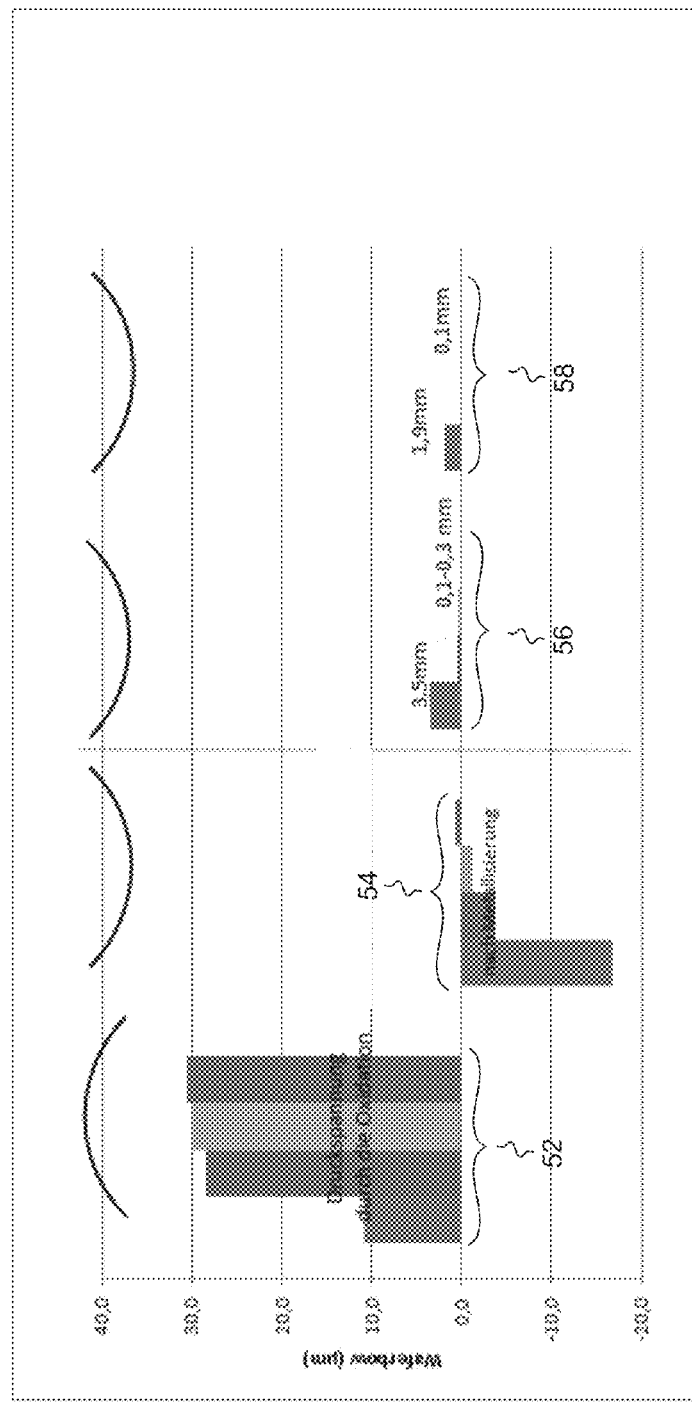
FIG. 5 illustrates wafer-bow measurement results of an embodiment.

FIG. 5 illustrates wafer-bow measurement results of an embodiment. The view graph in FIG. 5 is vertically divided in two parts, which show measurement results obtained with different measurement equipment and before (on the left) and after (on the right) thinning of the wafer. On the left hand side the view graph illustrates a wafer bow evoked by compression stress exerted on a semiconductor substrate by an oxide structure, where the different bars 52 indicate different oxidation levels in terms of surface coverage of the semiconductor device. From the left to the right these oxidation levels in bars 52 are 30%, 75%, 82%, and 84%, the corresponding wafer bows are approximately 11 µm, 28 µm, 30 µm, and 31 µm. The symbols above the bars in 52, 54, 56, and 58 (bowed lines) indicate the resulting type of stress, compression or tensile, which is compression stress exerted by the oxide layer on the very left hand side of FIG. 5 and tensile stress in the other cases.

The four bars 54 show the waver bow after tensile stress exerted by a metal layer was added to the wafer. From left to right and for the same oxidation levels (30%, 75%, 82%, and 84%), the overall wafer bow corresponds to approximately −17 µm, −4 µm, −2 µm, and 1 µm, where the negative values indicate tensile stress, cf. the symbol above the bars 54 being bowed in the opposite direction as in the symbol above bars 52. The right hand side of the view graph illustrates the wafer bow after thinning of the substrate, e.g. down to 70 µm, wherein the bars 56 and 58 show magnified values by a factor of 1000. The bars 56, and the symbol above, respectively, show that the tensile stress of the metal layer dominates after thinning of the wafer. For an oxidation level of 30% the wafer bow is approximately 3.5 µm and for the higher oxidation level it ranges between 0.1 µm and 0.3 µm. On the very right hand side the bars 56 indicate the wafer bow after tempering for two hours at a temperature of 400° C., which relaxes the metal layer structure. For the low oxidation level of 30% the wafer bow comes down to approximately 1.9 mm and for the higher level oxidations down to about 0.1 mm, where tensile stress still dominates.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons. Furthermore, in some embodiments a single step may include or may be broken into multiple sub steps. Such sub steps may be included and part of the disclosure of this single step unless explicitly excluded.

What is claimed is:

1. A semiconductor device, comprising
   a semiconductor substrate with a first region having a first conductivity type and a second region having a second conductivity type, the second region comprising one or more sections of the second conductivity type;
   an oxide structure with interrupted areas; and
   a metal layer structure being in contact with the second region at least at the interrupted areas of the oxide, wherein a projection of the oxide structure onto the second region determines at least two interrupted areas, which are separated by portions of the oxide structure, in at least one of the one or more sections of the second region.

2. The semiconductor device of claim 1, wherein the first region of the semiconductor substrate surrounds the second region of the semiconductor substrate.

3. The semiconductor device of claim 1, wherein the oxide structure is located between the metal layer structure and the second region of the semiconductor device, or wherein the metal layer structure is located between the oxide structure and the second region of the semiconductor device.

4. The semiconductor device of claim 1, wherein the oxide structure is enclosed by two metal layer structures in the area of the second region.

5. The semiconductor device of claim 1, wherein the metal layer structure corresponds to a power metal layer operable to contact the semiconductor device.

6. The semiconductor device of claim 1, wherein the metal layer structure exerts a force on the semiconductor substrate and wherein the oxide structure exerts a force on the semiconductor substrate or the metal layer structure, wherein the force exerted by the oxide structure is at least partly directed into an opposite direction of the force exerted by the metal layer structure.

7. The semiconductor device of claim 1, further comprising one or more other layers exerting force on the semiconductor substrate, wherein the oxide structure is configured to exert a force at least partly directed into an opposite direction of a combined force of at least two of the other layers.

8. The semiconductor device of claim 1, wherein the second region comprises two or more sections of the second conductivity type and wherein a projection of the oxide structure onto the second region subdivides at least one of the two or more sections of the second region into at least two interrupted areas separated by portions of the oxide structure.

9. The semiconductor device of claim 8, wherein a lateral width of a portion of the oxide structure is less than a diffusion length of charge carriers in the second region.

10. The semiconductor device of claim 1, wherein the oxide structure is symmetrical to at least one lateral direction along a surface of the semiconductor device.

11. The semiconductor device of claim 1, wherein the oxide structure comprises a grid-structure.

12. The semiconductor device of claim 1, wherein an area covered with oxide is smaller than an area of the interrupted areas.

13. A semiconductor wafer structure comprising a plurality of the semiconductor devices of claim 1.

14. The semiconductor wafer structure of claim 13, wherein the oxide structure extends throughout the plurality of the semiconductor devices.

15. The semiconductor wafer structure of claim 13, wherein the metal layer structure exerts a force on the semiconductor substrate, and wherein the oxide structure exerts a force on the semiconductor substrate or the metal layer structure, wherein the force exerted by the oxide structure is at least partly directed into an opposite direction of the force exerted by the metal layer structure.

16. The semiconductor wafer of claim 13, wherein the oxide structure is symmetrical to at least one wafer axis or radially symmetrical to the wafer structure.

17. A method for forming a semiconductor wafer structure, comprising forming a semiconductor substrate with a first region having a first conductivity type and a second region having a second conductivity type, the second region comprising one or more sections of the second conductivity type; and forming an oxide structure with interrupted areas of oxide and a metal layer structure contacting the second region at least at the interrupted areas of the oxide, wherein a projection of the oxide structure onto the second region determines at least two interrupted areas, which are separated by portions of the oxide structure, in at least one of the one or more sections of the second region.

18. The method of claim 17, wherein the oxide structure is formed by forming an oxide layer, and subsequently removing oxide from the formed oxide layer to obtain the interrupted areas in the oxide structure.

19. The method of claim 17, wherein the semiconductor substrate comprises silicon and wherein the oxide structure is formed using LOCal Oxidation of Silicon (LOCOS).

20. The method of claim 17, wherein the oxide structure is formed between the metal layer structure and the second region of the semiconductor substrate.

21. The method of claim 17, wherein the metal layer structure is formed between the oxide structure and the second region of the semiconductor substrate.

* * * * *